United States Patent [19]

Bertin et al.

[11] Patent Number: 5,561,622
[45] Date of Patent: Oct. 1, 1996

[54] INTEGRATED MEMORY CUBE STRUCTURE

[75] Inventors: Claude L. Bertin; Wayne J. Howell, both of South Burlington; Erik L. Hedberg, Essex Junction; Howard L. Kalter, Colchester; Gordon A. Kelley, Jr., Essex Junction, all of Vt.

[73] Assignee: International Business Machines Corporation, Armonk, N.Y.

[21] Appl. No.: 120,993

[22] Filed: Sep. 13, 1993

[51] Int. Cl.$^6$ .............................. G11C 5/06; H01L 23/02
[52] U.S. Cl. .............................. 365/51; 365/63; 257/686; 257/777
[58] Field of Search .................................. 365/51, 52, 63; 257/686, 724, 777; 361/684, 735

[56] References Cited

U.S. PATENT DOCUMENTS

| | | | |
|---|---|---|---|
| 2,907,926 | 10/1959 | Slack | 317/101 |
| 3,029,495 | 4/1962 | Doctor | 29/155.5 |
| 3,065,384 | 11/1962 | Sprude | 317/101 |
| 3,070,729 | 12/1962 | Heidler | 317/100 |
| 3,139,559 | 6/1964 | Heidler | 317/101 |
| 3,152,288 | 10/1964 | Mittler | 317/99 |
| 3,370,203 | 2/1968 | Kravitz et al. | 317/101 |
| 3,746,934 | 7/1973 | Stein | 317/101 |
| 3,748,479 | 7/1973 | Lehovec | 250/208 |
| 4,520,427 | 5/1985 | Brotherton et al. | 361/389 |
| 4,525,921 | 7/1985 | Carson et al. | 29/577 |
| 4,551,629 | 11/1985 | Carson et al. | 250/578 |
| 4,612,083 | 9/1986 | Yasumoto et al. | 156/633 |
| 4,638,348 | 1/1987 | Brown et al. | 357/74 |
| 4,646,128 | 2/1987 | Carson | 357/74 |

(List continued on next page.)

FOREIGN PATENT DOCUMENTS

| | | | |
|---|---|---|---|
| 206696 | 12/1986 | European Pat. Off. | 257/723 |
| 0535479 | 9/1992 | European Pat. Off. | H01L 25/065 |
| 2645-681 | 10/1990 | France | 257/686 |
| 58-103149 | 6/1983 | Japan | 257/700 |
| 59-205747 | 11/1984 | Japan . | |
| 61-35547 | 2/1986 | Japan . | |
| 61-168951 | 7/1986 | Japan | 257/724 |
| 62-16535 | 1/1987 | Japan | 257/724 |
| 63-186457 | 8/1988 | Japan | 257/700 |
| 1-53440 | 3/1989 | Japan | 257/686 |
| 2-36554 | 2/1990 | Japan . | |
| WO89/04113 | 5/1989 | WIPO . | |

OTHER PUBLICATIONS

Stoller, "Edge–Mounted Chip Assembly For Microprocessor", IBM Technical Disclosure Bulletin, vol. 23, No. 2, pp. 581–582, Jul. 1980.

Carson, "Unconventional focal–plane architecture (FPA)", SPIE, vol. 225, IR Image Sensor Tech., pp. 34–37, 1980.

Parks, "Batch–Fabricated Three–Dimensional Planar Coaxial Interconnections or Microelectronic Systems" IEEE Trans. on Computers, vol. C–20, No. 5, pp. 504–511, May 1971.

Agusta et al., "High Density Packaging of Monolithic Circuits", IBM Technical Disclosure Bulletin, vol. 10, No. 7, p. 890, Dec. 1967.

Bertin et al., "Evaluation of a 3D Memory Cube System", IEEE, pp. 12–15, 1993.

*Primary Examiner*—David C. Nelms
*Assistant Examiner*—Son Mai
*Attorney, Agent, or Firm*—Heslin & Rothenberg, P.C.

[57] ABSTRACT

An integrated memory cube structure and method of fabrication wherein stacked semiconductor memory chips are integrated by a controlling logic chip such that a more powerful memory architecture is defined with the functional appearance of a single, higher level memory chip. A memory/logic cube is formed having N memory chips and at least one logic chip, with each memory chip of the cube having M memory devices. The controlling logic chip coordinates external communication with the N memory chips such that a single memory chip architecture with N×M memory devices appears at the cube's I/O pins. A corresponding fabrication technique includes an approach for facilitating metallization patterning on the side surface of the memory subunit.

29 Claims, 4 Drawing Sheets

U.S. PATENT DOCUMENTS

| | | | |
|---|---|---|---|
| 4,706,166 | 11/1987 | Go | 361/403 |
| 4,727,410 | 2/1988 | Higgins, III | 357/74 |
| 4,764,846 | 8/1988 | Go | 361/388 |
| 4,801,992 | 1/1989 | Golubic | 357/40 |
| 4,818,728 | 4/1989 | Rai et al. | 437/209 |
| 4,833,568 | 5/1989 | Berhold | 361/383 |
| 4,862,249 | 8/1989 | Carlson | 357/80 |
| 4,868,712 | 9/1989 | Woodman | 361/388 |
| 4,879,258 | 11/1989 | Fisher | 437/225 |
| 4,894,706 | 1/1990 | Sato et al. | 357/72 |
| 4,901,136 | 2/1990 | Neugebauer et al. | 357/75 |
| 4,902,641 | 2/1990 | Koury, Jr. | 437/62 |
| 4,926,241 | 5/1990 | Carey | 357/75 |
| 4,956,746 | 9/1990 | Gates, Jr. et al. | 361/385 |
| 4,983,533 | 1/1991 | Go | 437/7 |
| 5,016,138 | 5/1991 | Woodman | 361/381 |
| 5,019,943 | 5/1991 | Fassbender et al. | 361/396 |
| 5,019,946 | 5/1991 | Eichelberger et al. | 361/414 |
| 5,051,865 | 9/1991 | Kato | 361/386 |
| 5,064,771 | 11/1991 | Solomon | 437/3 |
| 5,071,792 | 12/1991 | VanVanno et al. | 437/227 |
| 5,091,331 | 2/1992 | Delgado et al. | 437/62 |
| 5,128,831 | 7/1992 | Fox, III et al. | 361/684 |
| 5,162,254 | 11/1992 | Usui et al. | 437/63 |
| 5,266,833 | 11/1993 | Capps | 257/690 |
| 5,311,401 | 5/1994 | Gates | 257/686 X |
| 5,313,096 | 5/1994 | Eide | 257/686 |
| 5,347,428 | 9/1994 | Carson | 257/686 X | fig. 1 fig. 2 fig. 4 fig. 3 fig. 5 fig. 6

INTEGRATED MEMORY CUBE STRUCTURE

TECHNICAL FIELD

The present invention relates in general to high density electronic packaging which permits optimization of device performance within a given volume. More particularly, the invention relates to an integrated memory cube structure and method of fabrication wherein stacked semiconductor memory chips are integrated with controlling logic such that a more powerful memory architecture having the functions of a single, higher level memory chip is presented to external circuitry.

BACKGROUND ART

Conventionally, integrated circuit devices, such as memory devices, have been made from wafers of semiconductor material which include a plurality of integrated circuits. After a wafer is made, the circuits are separated from each other by dicing the wafer into small chips. Thereafter, the chips are bonded to carriers of various types, electrically interconnected by wires to leads and packaged.

By way of improvement, high density electronic packaging modules having multiple semiconductor chips have become popular. For example, U.S. Pat. Nos. 4,525,921 and 4,646,128 by Carson et al. disclose structure and fabrication techniques for producing one type of high density electronic processing package. Each of these patents describes a semiconductor chip stack consisting of multiple integrated circuit chips adhesively secured together. A metallized pattern is provided on one of the side surfaces of the stack for electrical connection of the stack to external circuitry. This metallization pattern typically includes both individual contacts and bused contacts. The stack is positioned on an upper surface of a substrate such that electrical contact is made between the stack metallization pattern and a substrate surface metallization pattern.

Traditionally, computer memory systems are assembled from many types of memory chips, such as, DRAMs, SRAMs, EPROMs and EEPROMs. The number of storage devices per memory chip technology generation varies but increases over time with more devices per chip being delivered with each succeeding generation, thereby providing greater memory capacity. When a next generation memory chip becomes available, the number of chips needed to make a given memory system is correspondingly reduced. With fewer memory chips needed, the resultant memory system becomes physically smaller.

Next generation DRAM memory chips have traditionally increased by 4×the number of bits compared with the current generation technology. For example, assume that the current generation of memory chips comprises 16 megabit (Mb) chips, then by industry standards the next generation will comprise 64 Mb memory chips. This 4×advancement from one generation of memory chip to the next is traditionally accomplished only with corresponding advancement in semiconductor tool and process technologies, for example, sufficient to attain a 2×reduction in surface geometries. Due to this interrelationship, a significant interval of time can pass between generations of memory chips. Therefore, a genuine improvement in memory system design and fabrication would be attained if current generation memory chips could be packaged to have the same functions and physical dimensions of an anticipated, next generation memory chip. The integrated memory cube structure and fabrication techniques presented herein provide such an improvement.

DISCLOSURE OF INVENTION

Briefly summarized, the present invention comprises in one aspect an integrated memory cube which appears to external, i.e., next level of packaging, circuitry to have a single memory chip architecture. The memory cube includes a combined memory chip and logic chip stack which has N memory chips (wherein $N \geq 2$) and at least one logic chip. Each memory chip has M memory devices (wherein $M \geq 2$), along with two substantially parallel planar main surfaces and an edge surface. The logic chip also has two parallel planar main surfaces and an edge surface. The chips are stacked such that at least one planar main surface of each chip is coupled to a planar main surface of an adjacent chip in the stack. The logic chip is electrically connected to each of the N memory chips and coordinates external communication with the N memory chips of the stack. The edge surfaces of the memory chips and the edge surface of the logic chip align to form at least one side surface of the stack. The stack also has an end surface disposed parallel to the planar main surfaces of the chips in the stack. The electrically connected logic chip and N memory chips have an integrated memory architecture which emulates a single memory chip structure with N×M memory devices.

In another aspect, the present invention comprises a method for fabricating an integrated memory cube which functionally emulates a single memory chip architecture. The fabricating method includes the steps of: Providing N memory chips (wherein $N \geq 2$) each having M memory devices (wherein $M \geq 2$), along with two substantially parallel planar main surfaces and an edge surface; providing a logic chip having two substantially parallel planar main surfaces and an edge surface; forming a stack by securing the N memory chips and the logic chip together such that at least one planar main surface of each chip in the stack is coupled to a planar main surface of an adjacent chip in the stack and such that the edge surfaces of the memory chips and the edge surface of the logic chip align to form at least one side surface of the stack, the stack also having an end surface disposed parallel to the planar main surfaces of the chips in the stack; and electrically interconnecting the logic chip and the N memory chips, the logic chip coordinating external communication with the N memory chips of the stack such that an integrated memory structure exists which emulates the functional characteristics of a single memory chip structure with N×M memory devices. A particularly novel process is also presented for facilitating side surface metallization of a plurality of semiconductor chip subassemblies using a sacrificial material disposed between the subassemblies.

A number of advantages are inherent in an integrated memory cube structure and fabrication approach in accordance with the invention. For example, the resultant structure can emulate a next generation memory chip using readily available existing generation memory chips. The cube can have physical dimensions within industry standards for a next generation memory chip. Testing and burn-in of the logic chip and memory chips can be separately conducted. Further, any number of semiconductor chips can be employed within the cube. The number employed depends upon the memory chip architecture selected and the memory cube architecture desired.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

An integrated memory cube in accordance with the invention can be implemented using any one of a variety of available memory chip architectures. By way of example, the following discussion assumes that four 16 Mb DRAMs are to be assembled in a stack. This memory cube emulates exactly a next generation memory chip, i.e., a 64 Mb DRAM. This integrated function is accomplished by associating a control logic chip with the stack of four memory chips. The resultant cube of four 16 Mb DRAMs plus logic chip can be sized to fit within an industry standard 64 Mb package, or if desired, a smaller package. Compared with single memory chips, there are significant processing, manufacturability and cost advantages to an integrated memory cube structure in accordance with this invention.

Figure 1:
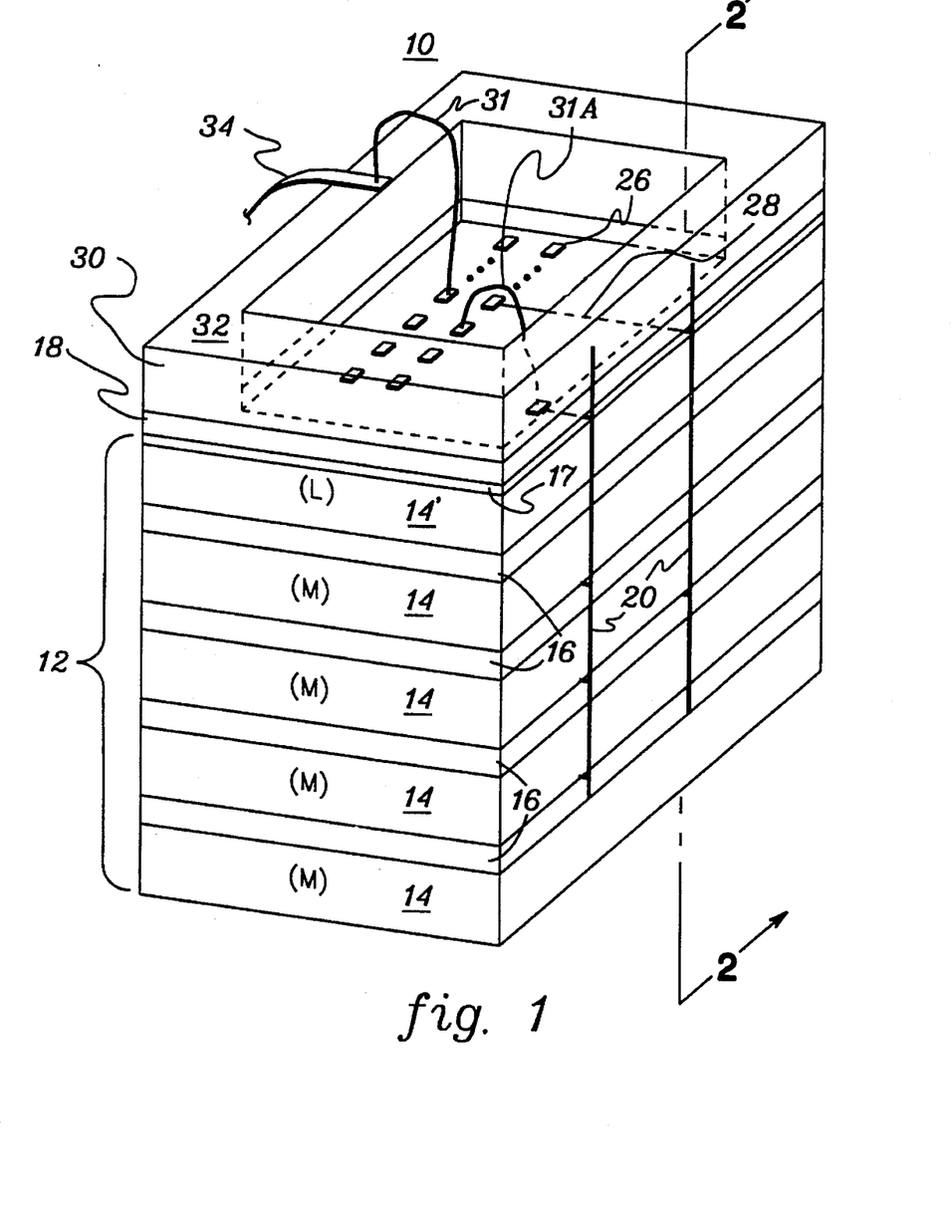
FIG. 1 is a perspective view of one embodiment of an integrated memory cube pursuant to the present invention.

In the figures, which are not drawn to scale for ease of understanding, the same reference numbers are used throughout multiple figures to designate the same or similar components. FIG. 1 depicts one embodiment of the integrated memory cube, generally denoted 10, pursuant to the invention. In this embodiment, four memory chips (M) 14 and one logic chip (L) 14' are connected in a stack 12 having the shape of a rectangular parallelepiped. Each chip 14 & 14' in the stack has two substantially parallel planar main surfaces and an edge surface with at least one planar main surface of each chip being coupled to a planar main surface of an adjacent chip in the stack 12. Multiple layers 16 (see FIGS. 2 & 4) are disposed between adjacent chips 14 & 14'. Each layer 16 contains appropriate transfer metallurgy 15 (FIG. 2) and passivation insulation layers 17A to provide electrical I/O to the storage devices of the respective memory chip 14. An adhesive layer 17 (FIG. 4) such as a Thermid® polymer (TM of National Starch and Chemical Co.) secures adjacent chips 14 & 14' together. Disposed at one end surface of stack 12 is a preformed spacer layer 18 which has a center opening therethrough.

In one embodiment, layer 18 comprises a Upilex (or alternative insulator) layer wherein the center opening is sized to expose at least a portion of an array of contact pads 26 on the upper surface of logic chip 14". The thickness of spacer layer 18 is sufficient to allow use of T-connects between transfer metallurgy on the upper surface of logic chip 14' and the at least one side surface of stack 12. Transfer metallurgy 28 along the top surface of logic chip 14' connects at least some of contact pads 26 with a metallization pattern 20 on the at least one side surface of the stack. Capability for logic function programming of a memory cube is provided with wire 31A in that specific logic functions are accessed by interconnecting surface pads 26. Only two metallization patterns 20 are depicted in FIG. 1 for clarity. All intra-stack wiring between logic chip 14' and memory chips 14 comprises 16 Mb wiring. Layers 16 include transfer metallurgy 15 from each memory chip 14 to the at least one side surface of the stack. T-connects are employed at the interface between the transfer metallurgies 15 and metallization pattern 20. If desired, multiple side surfaces of stack 12 could accommodate buses or other wiring connections to the semiconductor memory chips (M) and/or the logic chip (L).

A lead frame 32 is disposed above the exposed main surface of spacer layer 18. Lead frame 32 also includes an inner opening extending from its upper main surface to its lower main surface. In the embodiment depicted, this inner opening is sized substantially identical to the inner opening in spacer layer 18. However, such sizing relationship is not a requirement. More important is that at least some of the array of contact pads 26 on the upper surface of logic chip 14' remain exposed for wirebonding, for example, via conventional wires 31. External circuitry connects to module 10 via, for example, a lead 34. In actual implementation, there is a plurality of interconnections between logic chip 14' and lead frame 32 and between logic chip 14' and metallization pattern 20 on the at least one side surface of stack 12.

Figure 2:
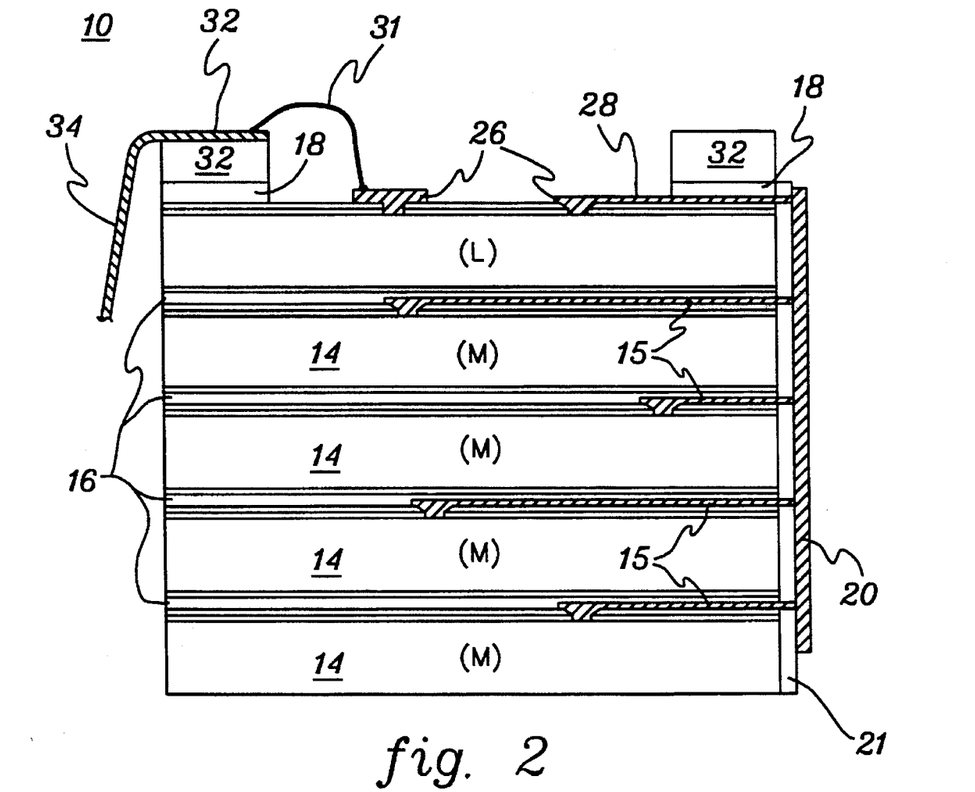
FIG. 2 is a cross-sectional elevational view of the integrated memory cube of FIG. 1 taken along lines 2—2.

The 64 Mb and 16 Mb wiring connections are also shown in FIG. 2. In this figure, wire 31 comprises 64 Mb wiring, while wires 15, 28 and 20 comprise 16 Mb wiring. A plurality of thin-film wirings would typically connect each memory chip (M) and the logic chip (L) to the side surface metallization pattern (20). To complete the package, an encapsulant (not shown) would surround the cube 10. The encapsulant could comprise any conventional encapsulating material. One feature to note is that external wiring (64 Mb) to integrated memory cube 10 is separate from intra-cube wiring, i.e., the 16 Mb wiring.

As noted, when packaged the dimensions of an integrated memory cube pursuant to the invention are such that the cube will fit within the target physical dimensions for a next generation memory chip. The basic method to "fit" an integrated memory cube, comprised of current generation chips, e.g., 16 Mb, into a plastic package that is smaller than the initial next generation, e.g., 64 Mb, industry standard (JEDEC) package is to trade plastic encapsulation material for additional silicon chips. Historically, initial next generation chip packaging grows in length and width proportional to next generation chip size. Plastic package height, however, has remained constant through several memory chip technology generations. For a given chip technology generation, e.g., 16 Mb, as the fabrication processes and manufacturing tool technology mature, there is usually a complementary reduction in chip length and width, i.e., the chip size shrinks as the technology matures, with a commensurate reduction in plastic packaging size. In general, this shrinking proceeds to the point where the next generation chip approximately equals the size of the previous, fully mature, generation. Therefore, a memory cube that emulates a next generation technology, in accordance with the present invention, can be readily fabricated to have smaller length and width than the initial single next generation memory chip.

The height of the memory cube plastic package can exactly meet the next generation JEDEC height standards by reducing the thickness of the plastic encapsulant and/or reducing the thickness of the memory chips comprising the memory cube; thereby resulting in a smaller plastic package compared with single chip next generation packaging.

Further, very little semiconductor area is required to implement the logic functions described below. Therefore, extra area within logic chip 14' can be used for customer-specific applications. These applications include SRAM, psuedostatic RAM, error correction code, memory handshaking, and array built-in self-testing. Inclusion of such applications on logic chip 14' could dramatically improve performance of the cube for customer-specific uses.

Wirebond connecting logic chip 14' with package lead frame 32 can be fabricated using "lead-on-chip" technology, as with any semiconductor chip. Metallization pattern 20, disposed on an insulator 21, is used to interconnect electrically the memory chips in stack 12 and the logic chip 52. T-connects are used to interconnect transfer metallurgy 15 with metallization 20 and spacer layer 18 metallization 28 with metallization 20. The resultant structure is injection molded with a protective encapsulant. The particular stacking configuration depicted in FIGS. 1 & 2 could obviously be generalized for other integrated circuit chip stacks. For example, one or more of the memory chips in the stack could be replaced by a logic chip and/or a combined logic and memory chip. Further, the number of semiconductor chips in the stack could be modified as needed for a particular implementation.

Figure 3:
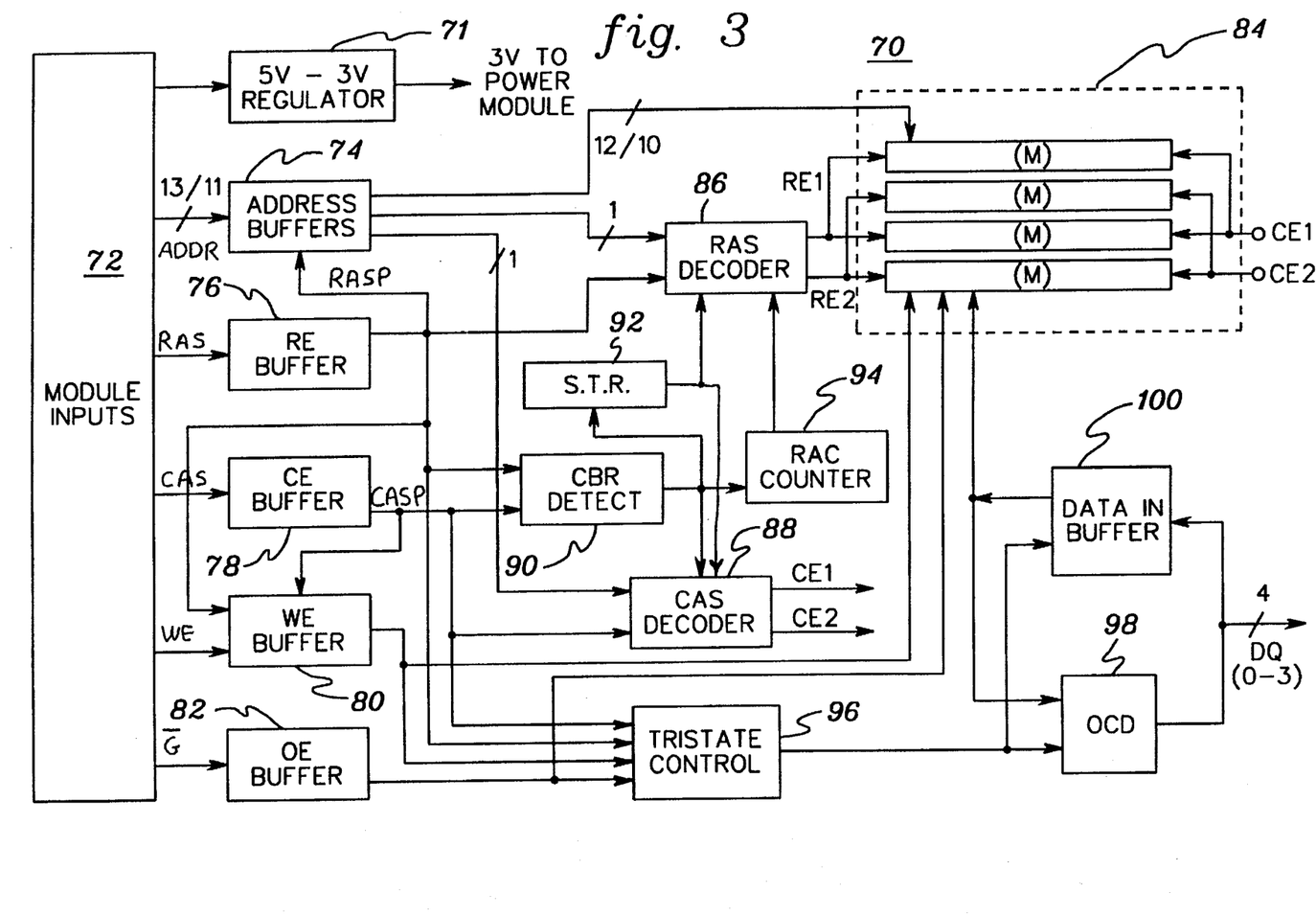
FIG. 3 is a block diagram schematic of one embodiment of a controlling logic circuit for the memory cube of FIG. 1.

An overview of one embodiment of a control logic circuit in accordance with the present invention is depicted in FIG. 3. This logic circuit, denoted 70, receives address and control inputs 72 from a memory controller (not shown) or other external processing unit. Logic circuit 70 is designed to industry standards for a next generation single memory chip input timings. For example, if the semiconductor memory chips in the stack comprise 64 Mb memory chips, then logic 70 would have the same I/O characteristics as a 256 Mb single memory chip. A voltage regulator 71 can be provided to allow powering of logic circuit 70 by either a five volt or three volt source. This suggests another feature of the invention. If desired, the Logic chip could be powered at a different voltage level than the supply provided to the chip stack 84.

As a further example, four 4 Mb×4, 12/10 addressable 16 Mb memory chips are assumed to define stack 84. Each chip provides ¼ of a 64 Mb memory array. Assume further that a desired product is a 13/11 addressable, 16 Mb×4 array. With such an input, 13 bits; enter address buffers 74. Thus, a 12 bit signal is passed from address buffer 74 to stack 84. During RAS time, one bit of the incoming 13 bits is split off and fed to a RAS decoder 86. Similarly, during CAS time, one bit of the received 11 bit signal is split off and fed to a CAS decoder 88. RAS and CAS timing pulses are received by a RAS enable buffer 76 and a CAS enable buffer 78, respectively, from module input 72.

Output from buffer 76 is a RASP signal comprising a 2RAS pulse, positive active high. This pulse is output from RE buffer 76 whenever the buffer detects its input going low. The signal is also fed to address buffer 74 to enable/disable the address buffers. Similarly, output CASP from CE buffer 78 is fed to a write enable buffer 80 to provide enable/disable control. Output from RAS enable buffer 76 and one address from address buffer 74 are fed to RAS decoder 86, which outputs two signals RE1 and RE2. Together, these signals select two of the four memory chips in stack 84. Only signal RE1 or signal RE2 has an applied voltage (i.e., is in active state) based upon the inputs received by RAS decoder 86.

Note that the approach to selecting a particular semiconductor chip is dependent upon the architecture employed. For example, if an 11/11 4 Mb×4 semiconductor chip is used then two bits would be required for input to the RAS decoder. Upon receipt of an appropriate RASP pulse one of the four semiconductor chips would be directly selected by the RAS decoder. In such a case, the CAS decoder output would be connected to all four chips in stack 84. However, with 12/10 16 Mb chips, CAS decoder 88 must output one of two signals CE1 and CE2. Signals CE1 and CE2 are fed to the memory chips of stack 84 in an interleaved fashion relative to signals RE1 and RE2. Thus, at RAS time, two of the four semiconductor chips are selected and at CAS time one of the two previously selected chips is identified as containing the particular address to be accessed by the 12/10 address signal forwarded from address buffer 74 to the stack. The appropriate four data bits from the selected memory chip will then be accessed and output via off chip driver 98 to a main bus DQ (0–3).

A comparator is employed as a CBR detect circuit 90 to identify the JEDEC standard timing of when a CAS pulse occurs before a RAS pulse. Such an ordering occurs when the memory controller (or system controller) directs that a memory refresh should occur. A RAC counter 94 counts each CBR output pulse and sequentially directs which semiconductor chip in stack 84 is to be refreshed. Thus, sequential refreshing of semiconductor chips is ensured irrespective of which chip signal RAS 13 and signal CAS 11 identify. A self-time refresh (STR) circuit 92 also receives output from CAS before RAS detect 90. This circuit controls initiation of a "sleep mode" whereby if the CAS signal appears before the RAS signal and, for example, is held active for at least 100 microseconds, sleep mode for all four 16 Mb ×4 semiconductor chips are invoked via RAS decoder 86 and CAS decoder 88.

In addition to write enable buffer 80, an output enable buffer 82 receives pulse signals from said external source. Outputs from buffers 76, 78, 80 and 82 are fed to a conventional tristate control 96 which feeds off chip driver (OCD) 98 and a data in buffer 100. Tristate control 96 deselects the data in buffer 100 when an output is being driven to bus DQ (0–3) or, alternatively, turns off OCD 98 when data is being received at buffer 100.

Note that logic circuit 70 is in addition to the standard logic and timing circuits inherent on the 16 Mb semiconductor memory chips in stack 84. Logic circuit 70 comprises a control logic circuit designed to emulate a single semiconductor memory chip, in this case a 64 Mb chip. Thus, for a particular implementation, logic circuit 70 is designed with two constraints. The first constraint comprises the known architecture of the selected memory chips in the stack, and the second constraint comprises the JEDEC standard operation of a 64 Mb chip. Further, note that logic circuit 70 can be employed in different memory I/O configurations. For example, if for a given application a by eight bit output is desired, then two cubes, each having a control logic circuit 70 and four memory chips (each by four), can be coupled together to mimic the desired by eight architecture.

Fabrication of an integrated memory cube in accordance with this invention is analogous in many respects to the fabrication approach presented in copending U.S. patent application entitled "Polyimide-Insulated Cube Package of Stacked Semiconductor Device Chips," Ser. No. 08/080, 453, filed on Jun. 21, 1993, which is assigned to the same assignee as the present application, and which is hereby incorporated herein by reference.

Figure 4:
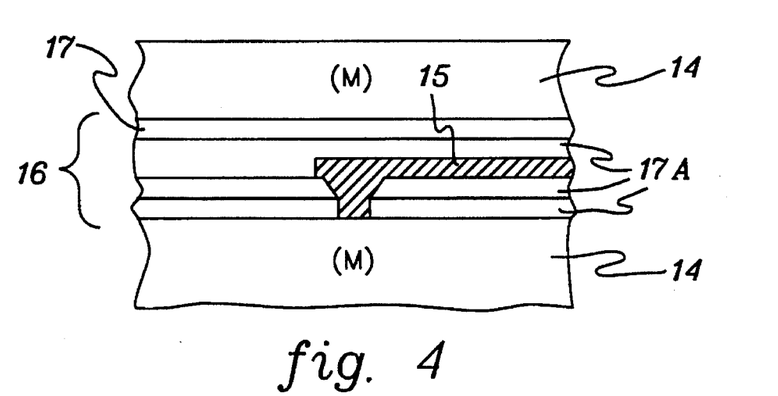
FIG. 4 is an enlarged partial cross-section of one embodiment of the layers disposed between two opposing planar surfaces of adjacent memory chips within an integrated memory cube pursuant to the present invention.

FIG. 4 depicts an enlarged cross-section of two adjacent memory chips in an integrated memory cube pursuant to this invention. As noted previously, layers 16 include, e.g., transfer metallurgy 15, appropriate insulating layers 17A and an adhesive layer 17 to secure adjacent memory chips together. As a specific example, transfer metallurgy 15 could comprise titanium/aluminum/copper, and would be surrounded by multiple insulating layers 17A, for example, polyimide. Finally, an adhesive layer 17 is disposed upon these layers to allow adjacent chips to be secured together. A preferred commercially available adhesive is the above-referenced Thermid®. Obviously, other inter-chip layer configurations could be employed by one skilled in the art without departing from the novel concepts set forth herein.

Figure 5:
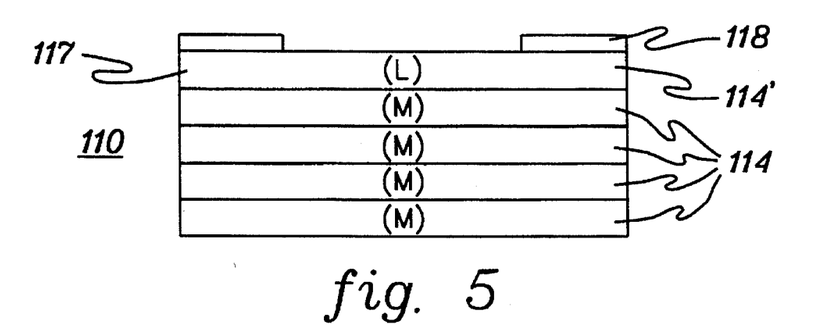
FIG. 5 is an elevational view of one embodiment of a memory stack and spacer layer subassembly in accordance with the present invention.
Figure 6:
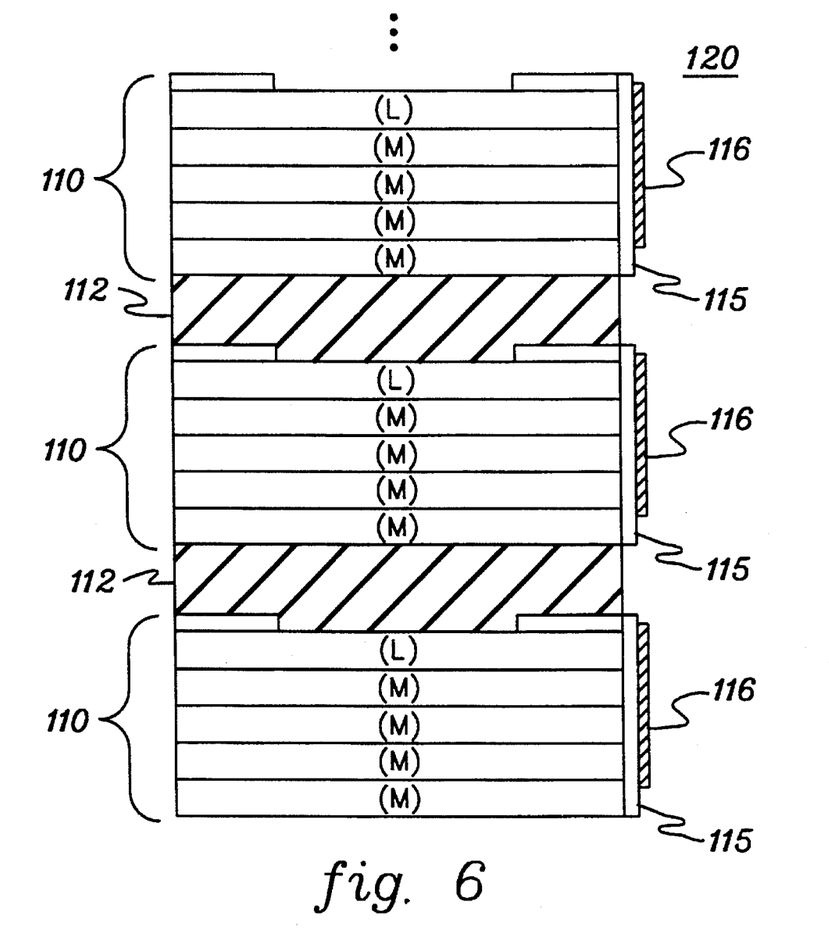
FIG. 6 is an elevational view of one embodiment of multiple subassemblies of FIG. 5 arranged in a single extended stack to facilitate side surface metallization processing of each subassembly in accordance with a fabrication technique pursuant to the present invention.

Referring to FIG. 5, a preferred processing approach is to produce multiple subassemblies 110 comprising stacked memory chips 114, logic chip 114' and a preformed spacer layer 118, for example, fabricated of Upilex. As shown in FIG. 6, these memory subassemblies are produced by stacking and laminating the individual components (114, 114' and 118) in the preferred configuration. Segmentation layer 112 (e.g., parylene), interposed between memory subassemblies 110, is incorporated into stack 120 to facilitate segmentation of the subassemblies. Side face processing is comprised of insulation layer 115 and metallization layer 116. Once side surface metallization is complete, the subassemblies are segmented and cleaned. The resulting assembly of logic chip, memory chips and Upilex comprises the functional portion of the cube. Once the lead frame is connected, the assembly can then be packaged using standard plastic encapsulation technology currently used for single-chip memory chips.

Thus, cube fabrication is subdivided into five basic process sectors: (1) wafer-level processing where the transfer metal, polyimide passivation, and Thermid® polymer (trademark of National Starch and Chemical Co.) are deposited/applied onto the memory and logic chips still in wafer form; (2) dice and lamination processing where the wafers are diced into individual chips, then stacked and laminated into a cube format (FIG. 5) with upper layers of Upilex 118 and parylene segmentation polymer 112 (FIG. 6); (3) cube-level processing where thin-film deposition occurs on an assembly side surface (This last sector results in the electrical interconnection of the individual memory chips and the logic chip, and fabrication of a functional integrated memory cube.); (4) attachment and interconnection of the cube and lead frame; and (5) plastic encapsulation of this assembly.

An advantage of a cube structure in accordance with the present invention is the separation of 64 Mb wiring and 16 Mb wiring. Referring to FIGS. 1 & 2, the 64 Mb wiring connects the lead frame and contact pads on the logic chip, while the 16 Mb wiring connects certain logic chip contact pads with the side surface metallization pattern and the transfer metallurgies on the memory chips. Thus, potential wiring blockage or congestion problems from use of two different wiring types are minimized.

Upilex is the trade name of a class of commercially available polymer films manufactured by UBE Industries, Inc. Upilex-S is a preferred one of these films. The specific polyimide used in Upilex-S films is BPDA-PDA, poly-(bisphenyldianhydride-para-phenyldiamine). See the incorporated application for a detailed discussion and references on the preparation and properties of BPDA-PDA polyimide. There are a number of commercially available polyimide-based alternatives to Upilex-S that satisfy the technology needs of the present invention, including: Upilex-R (UBE Industries, Inc. trademark for a BPDA-ODA [poly(bisphenyldianhydride-oxydianiline]film), Kapton-H (E. I. DuPont de Nemours & Co. trademark for a PMDA-ODA [pyromelliticdianhydride-oxydianiline]) film, and Kapton-E (E. I. DuPont de Nemours & Co. trademark). As can be seen, there is a wide range of candidate materials that can be used in preforming the spacer layer.

Further, one need not be restricted to just using a polyimide spacer layer. Alternatives that will accomplish the same function include: thin ceramic substrates, AlN substrates, and insulated Si. Upilex is the preferred embodiment, however, because it meets the technology requirements and is relatively inexpensive.

With reference to the segmentation material, parylene is the generic name for a family of polymers developed by Union Carbide. They are typically prepared by vacuum pyrolysis of cyclic di-para-xylenes and their derivatives. According to a preferred fabrication process, parylene deposition occurs after flex deposition. Note that it is unnecessarily restrictive to limit the present process to only having parylene as the segmentation material. The technology requirements for this material are:

1. a sufficient adhesive strength to "hold" stack assemblies together for side surface processing;
2. an ability to withstand side surface processing temperatures;
3. an ability to withstand side surface processing environments and solvents;
4. segmentability, i.e., allows segmentation of stacked cube assemblies at a temperature below approximately 400° C. (essentially it must be a material that goes through an appropriate phase transition below 400° C.); and
5. an ability to remove the material from the top surface of the spacer and, logic chip to attain an acceptable lead frame wirebond attachment, and an acceptable lead frame attachment. Removal methods include: thermal decomposition, plasma etching, wet etching, $O_2$ ashing, and solvation. The specific method used depends upon the type and properties of segmentation material used.

Parylene is a material that meets these requirements, but there are other candidate materials that may also meet them, including: poly(alpha methyl styrene) and poly(methylmethacrylate). In addition, there are a large number of materials grouped together under the name of thermoplastics from which one can choose specific materials that meet these requirements. These thermoplastics are also commercially available.

The basic approach to segmentation is one where the temperature of the extended stack is elevated to a point for which a phase transition in the segmentation material occurs and a shear force is applied to the stack assemblies. Another approach would be one for which the temperature of the cubes is lowered to a point where the mechanical properties of the segmentation material are altered such that facile segmentation is possible. One can envision the limit of this being a cryogenic separation process where the temperature is lowered to a point that the segmentation material becomes extremely brittle and the extended stack literally falls apart into the constituent cubes.

Depending upon the specific material used, the method of application will vary. As noted, parylene requires vacuum pyrolysis. Other easier and less costly candidate methods might employ: liquid dispensing, spin applying, paste dispensing, and/or paste screening.

With the above overview, one specific cube fabrication sequence is to:

1. Align and stack memory logic chips and Upilex layer with parylene per FIGS. 4 & 6;
2. Laminate this assembled structure using elevated pressure and temperature;
3. Polish at least one side surface, exposing the transfer metallurgy leads of the individual memory chips;
4. Preferentially etch back the Si from the polished side surface(s) such that the transfer metallurgy lead extends above the surface defined by the etched Si;
5. Prepare at least one side surface for polyimide (PI), apply and cure
   a. $O_2$ plasma etch cube face
   b. Apply adhesion promoter
      Currently an aminopropylsilane
      Spin, apply and dry
      (Both of those steps are important, but are not absolutely required for this technology.);
6. Apply and cure the side surface polyimide
   Current PI is PMDA-ODA
   Many polyimides can be used (see the incorporated application),
   Currently polyamic acid PI precursor is spun applied to the cube face and oven cured to 350° C. in a $N_2$-atmosphere;
7. Polish the; side surface(s) to expose the transfer metallurgy leads;
8. Deposit cube face metallurgy
   a. Define thin film pattern using standard photolithographic techniques,
      Each cube assembly in the large stack it treated independently from a photolithographic standpoint; therefore, cube assembly stacking tolerances are not critical;
9. Subunit segmentation
   a. Cut cube face polyimide layer along parylene segmentation layer,
      Current Technique: Scalpel
      Alternatives include: Etching a trench and laser ablating a trench,
   b. Separate cube assembly from cube stack
      Current Technique: Precision shearing of each subunit at elevated temperature
      If parylene, more specifically Parylene-N, is the segmentation polymer, then the segmentation must occur above glass transition temperature (50°–80° C.) and preferably above its melting point (approximately 230° C.)
      and alternative to Parylene-N is Parylene-C, which has a glass transition temperature of 80° C. and a melting point of approximately 290° C.;
10. Remove residual segmentation material from spacer layer and logic chip for each subunit
    Elevated parylene above its thermal decomposition temperature (Parylene-N: 320° C., Parylene-C: 400° C.)
    $O_2$ plasma etch spacer layer surface
    During thermal decomposition temperature, an anneal of the T-Connect metallurgy is also achieved.

As noted above, 64 Mb wiring and 16 Mb wiring are employed in the specific example presented herein, however, the present invention is not restricted to this particular memory technology. Rather, reference to 16 Mb wiring and 64 Mb wiring is made to distinguish between the two different wiring functions. Electrical connection to the contact pads of the logic chip is accomplished by ultrasonically (or thermosonically) bonding a wire between a logic chip and the lead frame surrounding the logic chip.

At this point, assembly of the logic chip, spacer layer, and memory chips is completed. The resultant structure is a stand alone microelectronic entity that emulates a single integrated circuit memory chip. The last step in the fabrication process is to "package" this entity. The most common way to package memory chips is to interconnect the chip I/O to a lead frame and then encapsulate the lead frame/chip assembly using plastic, i.e., to form a TSOP or SOJ. The same is done for an assembled structure in accordance with the present invention. Industry standard practices and materials for lead frame attachment, wirebond interconnection, and plastic encapsulation, using injection molding techniques, can be used to package this assembly. Once encapsulated, fabrication and packaging of the integrated memory module cube is complete.

As set forth above, there are a number of inherent advantages in the integrated memory cube structure and fabrication approach of the present invention. The resultant structure emulates a next generation memory chip using readily available existing generation memory chips. Further, a cube can have physical dimensions within industry standards for an initial next generation memory chip. Testing and burn-in of the logic chip and memory chips can be separately conducted, thereby identifying a potential defect at a lower level of assembly. Further, any number of semiconductor chips can be employed within a cube. The number employed depends upon the memory chip architecture selected and the memory cube architecture desired.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. An integrated memory cube which to external circuitry emulates a single memory chip architecture, said integrated memory cube comprising:

a combination memory chip and logic chip stack including
   (i) N memory chips (wherein $N \geq 2$) each having M storage devices (wherein $M \geq 2$), along with two substantially parallel planar main surfaces and an edge surface,
   (ii) a logic chip electrically connected to each of the N memory chips for coordinating external circuitry communication with the N×M storage devices of the stack, said electrically connected logic chip and N memory chips having an integrated memory architecture that emulates to said external circuitry a single memory chip architecture with said N×M storage devices, wherein said external circuitry addresses said stack through said logic chip as said single memory chip architecture, said logic chip also having two parallel planar main surfaces and an edge surface, and
   (iii) at least one planar main surface of each chip in the stack being coupled to a planar main surface of an adjacent chip in the stack, the edge surfaces of the N memory chips and the edge surface of the logic chip aligning to form at least one side surface of the stack, said stack also having an end surface disposed parallel to the planar main surfaces of the chips in the stack.

2. An integrated memory cube architecture comprising:

a combination memory chip and logic chip stack including (i) N memory chips (wherein N≧2) each having M storage devices (wherein M≧2), along with two substantially parallel planar main surfaces and an edge surface, (ii) a logic chip electrically connected to each of the N memory chips for coordinating external communication with the N memory chips of the stack, said logic chip also having two parallel planar main surfaces and an edge surface, (iii) at least one planar main surface of each chip in the stack being coupled to a planar main surface of an adjacent chip in the stack, the edge surfaces of the N memory chips and the edge surface of the logic chip aligning to form at least one side surface of the stack, said stack also having an end surface disposed parallel to the planar main surfaces of the chips in the stack, and (iv) wherein one of said two parallel planar main surfaces of said logic chip comprises an upper surface of the logic chip, and wherein said upper surface of the logic chip includes an array of contact pads, at least some of said contact pads of said array of contact pads comprising I/O contacts for external circuitry connection to the stack.

3. The integrated memory cube of claim 2, wherein the logic chip is disposed at an end of the stack such that the upper surface of the logic chip comprises the end surface of the stack.

4. The integrated memory cube of claim 3, further comprising a lead frame secured to the stack adjacent its end surface, said lead frame having an inner opening extending therethrough such that at least a portion of the array of contact pads on the upper surface of the logic chip remains exposed.

5. The integrated memory cube of claim 4, further comprising conventional wirebonding electrically connecting the lead frame and at least some of the exposed contact pads of the array of contact pads on the upper surface of the logic chip.

6. The integrated memory cube of claim 3, further comprising a spacer layer disposed on the end surface of the stack, said spacer layer having an inner opening extending therethrough and sized to expose at least a portion of the contact pads on the upper surface of the logic chip, said spacer layer having a thickness sufficient to allow formation of T-connects along the at least one side surface of the stack adjacent to the upper surface of the logic chip.

7. The integrated memory cube of claim 6, further comprising a lead frame secured to on exposed surface of the spacer layer, said lead frame also having an inner opening extending therethrough sized such that the contact pads exposed through the spacer layer are also exposed through the lead frame.

8. The integrated memory cube of claim 7, further comprising conventional wirebonding electrically connecting the lead frame and at least some of the exposed contact pads on the upper surface of the logic chip.

9. The integrated memory cube of claim 2, wherein at least two of said contact pads of said array of contact pads are electrically interconnected for logic function programming.

10. The integrated memory cube of claim 1, wherein the logic chip includes logic means for holding each of said N memory chips of the stack in a sleep mode in response to a control command received from external circuitry.

11. The integrated memory cube of claim 1, wherein the logic chip is electrically connected to receive an address signal from external circuitry and wherein the logic chip includes logic means for decoding the address signal to identify at least one memory chip of the M memory chips having a memory device addressed by the address signal.

12. The integrated memory cube of claim 1, wherein the logic chip includes logic means for sequentially refreshing each of the N memory chips in the stack.

13. The integrated memory cube of claim 12, wherein the logic means for sequentially refreshing includes a counter connected to sequentially track which memory chip of said N memory chips in the stack is to be refreshed.

14. The integrated memory cube of claim 1, wherein the logic chip includes logic means for regulating a received voltage to an on-chip voltage for powering at a desired level.

15. The integrated memory cube of claim 1, wherein N equals four.

16. The integrated memory cube of claim 1, wherein the N memory chips each comprise a RAM chip.

17. The integrated memory cube of claim 1, wherein at least some of the N memory chips include transfer metallurgy extending to the at least one side surface of the stack, and wherein the integrated memory cube further comprises a metallization pattern disposed on the stack's at least one side surface and electrically connecting the transfer metallurgy extending thereto.

18. The integrated memory cube of claim 17, wherein the metallization pattern disposed on the stack's at least one side surface electrically connects with the transfer metallurgy extending to the at least one side surface of the stack via T-connects.

19. The integrated memory cube of claim 18, wherein the logic chip is disposed adjacent to the end surface of said stack and includes transfer metallurgy extending to the at least one side surface of the stack, and wherein the integrated memory cube further comprises a spacer layer covering the logic chip and having an edge aligned with the at least one side surface of the stack, the spacer layer having a width and thickness sufficient to allow T-connects between the transfer metallurgy on the logic chip extending to the at least one side surface of the stack and the metallization pattern disposed on the at least one side surface of the stack.

20. An integrated memory cube which emulates for external circuitry a single memory chip architecture, said integrated memory cube comprising:

N memory chips (wherein N≧2) each having M storage devices (wherein M≧2), each memory chip of said N memory chips comprising a first single chip memory architecture, said N memory chips being laminated together in a stack; and a logic circuit electrically connected to each of the N memory chips for coordinating external circuitry communication with the N×M storage devices of the stack, said electrically connected logic circuit and N memory chips having an integrated memory architecture which emulates for said external circuitry a second single chip memory architecture having N×M storage devices, said second single chip memory architecture comprising a different memory chip architecture from said first single chip memory architecture of each of said N memory chips.

21. The integrated memory cube of claim 20, wherein said logic circuit comprises a logic chip laminated to said stack.

22. The integrated memory cube of claim 20, wherein said logic circuit comprises a memory controller.

23. An integrated multichip memory module which emulates to external circuitry a single chip memory architecture, said integrated multichip memory module comprising:
- a memory subunit having N memory chips (wherein N≧2), each memory chip of the memory subunit having M memory devices (wherein M≧2), along with two substantially parallel planar main surfaces and an edge surface, at least one planar main surface of each memory chip being coupled to a planar main surface of an adjacent memory chip of the memory subunit such that said memory subunit has a stack structure; and
- logic means electrically connected to each of the N memory chips for coordinating external circuitry communication with said N memory chips of said memory subunit such that an integrated memory architecture with said N×M memory devices; exists which appears to said external circuitry to comprise said single chip memory structure with N×M memory devices.

24. The integrated multichip memory module of claim 23, wherein said logic means; comprises a logic chip mechanically coupled to said memory subunit.

25. The integrated multichip memory module of claim 23, wherein said logic means includes means for holding said N memory chips of said memory subunit in a sleep mode in response to a control command received from external circuitry.

26. The integrated multichip memory module of claim 23, wherein said logic means is connected to receive an address signal for said single chip memory structure from said external circuitry and wherein said logic means includes means for decoding said address signal to identify at least one of said N memory chips of said memory subunit having an addressed memory device identified by the address signal.

27. The integrated multichip memory module of claim 23, wherein said logic means includes means for sequentially refreshing each of said N memory chips of said memory subunit.

28. The integrated multichip memory module of claim 27, wherein said means for sequentially refreshing includes a counter connected for sequentially tracking a last refreshed memory chip of said N memory chips in said memory subunit.

29. The integrated multichip memory module of claim 23, wherein said memory subunit is powered at a first voltage level and said logic means is powered at a second voltage level.

* * * * *

UNITED STATES PATENT AND TRADEMARK OFFICE
CERTIFICATE OF CORRECTION

PATENT NO. : 5,561,622
DATED : Oct. 1, 1996
INVENTOR(S) : Bertin et al.

It is certified that error appears in the above-indentified patent and that said Letters Patent is hereby corrected as shown below:

| | |
|---|---|
| Column 3, line 66 | "14''" should read --14'--. |
| Column 9, line 31 | "the;" should read --the--. |
| Column 12, line 11 | "M" should read --N--. |
| Column 13, line 24 | "means;" should read --means--. |

Signed and Sealed this

Sixteenth Day of September, 1997

Attest:

Attesting Officer

BRUCE LEHMAN

Commissioner of Patents and Trademarks